United States Patent

Jang et al.

[11] Patent Number: 5,926,722
[45] Date of Patent: Jul. 20, 1999

[54] PLANARIZATION OF SHALLOW TRENCH ISOLATION BY DIFFERENTIAL ETCHBACK AND CHEMICAL MECHANICAL POLISHING

[75] Inventors: S. M. Jang, Hsinchu; C. H. Yu, Keelung, both of Taiwan

[73] Assignee: Taiwan SemiConductor Manufacturing Co., Ltd., Hsinchu, Taiwan

[21] Appl. No.: 08/835,327

[22] Filed: Apr. 7, 1997

[51] Int. Cl.⁶ ..................................................... H01L 21/76
[52] U.S. Cl. ........................... 438/424; 438/692; 438/734; 438/743; 438/756
[58] Field of Search ................................ 438/424, 691, 438/692, 693, 734, 735, 745, 750, 700, FOR 227, 743, 756, FOR 128

[56] References Cited

U.S. PATENT DOCUMENTS

| | | |
|---|---|---|
| 4,853,344 | 8/1989 | Darmawan . |
| 5,665,635 | 9/1997 | Kwon . |
| 5,702,977 | 12/1997 | Jang et al. . |
| 5,726,090 | 3/1998 | Jang et al. . |
| 5,731,241 | 3/1998 | Jang et al. . |
| 5,741,740 | 4/1998 | Jang et al. . |
| 5,786,262 | 7/1998 | Jang et al. . |
| 5,811,345 | 9/1998 | Yu et al. . |

FOREIGN PATENT DOCUMENTS 4-32245  2/1992  Japan .

OTHER PUBLICATIONS

Huang, J., et al., "Dependence of Film Properties of Subatmospheric Pressure . . . Ratio", J.Electrochem.Soc., vol.140, No.6, pp. 1682–1686, Jun. 1993.

Kwok, K., et al., "Surface Related Phenomena in Integrated PECVD/Ozone–TEOS SACVD . . . Effects", J.Electrochem-.Soc., pp. 2172–2177, Aug. 1994.

*Primary Examiner*—George Fourson
*Attorney, Agent, or Firm*—Ladas & Parry

[57] ABSTRACT

A new method for planarization of shallow trench isolation is disclosed by using wet selective etching. The formation of the shallow trench isolation described herein includes a pad layer, a silicon nitride layer formed on a semiconductor substrate. A PE-TEOS oxide layer is subsequently formed on the silicon nitride layer. Then a shallow trench is created by photolithography and dry etching processes to etch the PE-TEOS oxide layer, the silicon nitride layer and the pad layer. Then, the photoresist is removed, an ozone-TEOS layer is form in the shallow trench and on the PE-TEOS oxide layer for the purpose of isolation. A wet selective etching is used to etch the ozone-TEOS layer. A CMP is performed to make the surface of the substrate with a planar surface. Then, a thermal annealing is used for densification of the ozone-TEOS layer and for forming a lining oxide to improve the isolation of the shallow trench isolation.

20 Claims, 4 Drawing Sheets

PLANARIZATION OF SHALLOW TRENCH ISOLATION BY DIFFERENTIAL ETCHBACK AND CHEMICAL MECHANICAL POLISHING

FIELD OF THE INVENTION

The present invention relates to a method of isolation for integrated circuit (IC), and more specifically, to a method of planarization for the shallow trench isolation, which is done by using a selective wet etching and a chemical mechanical polishing.

BACKGROUND OF THE INVENTION

To manufacture electric circuits involves the formation of isolations between devices. Thus, to fabricate ICs, devices isolated from one another must first be formed in the silicon substrate. Establishing effective isolation in submicron ICs in the face of decreased isolation space is a complicated and challenging task. In ULSI, a tiny amount of leakage per device can induce significant power dissipation for the entire circuit.

Up to now, many of isolation technologies have been proposed such as LOCOS (LOCal Oxidation of Silicon), shallow trench isolation (STI) and so on. The most widely used method for generating the isolation is the LOCOS structure. The LOCOS involves the formation of Field OXides (FOX) in the nonactive regions of the substrate. As device geometry reaches submicron size, conventional LOCOS isolation has a limitation. For example, the bird's beaks structure and shape causes unacceptably large encroachment of the field oxide into the device active regions. Further, the planarity of the surface topography is inadequate for submicron lithography needs. Therefore, trench isolation is one of the newer approaches adopted.

Trench isolation is used primarily for isolating devices in VLSI and ULSI, and hence they can be considered as replacement for conventional LOCOS isolation. Further, shallow trench isolation is gaining popularity for quarter-micron technology. In the basic shallow trench isolation (STI) technology, shallow trenches are aniisotropically etched into the silicon substrate. Next, a CVD oxide is deposited onto the substrate and is then be planarization by CMP (Chemical Mechanical Polishing) or etching back. Another way of the technology is called a Buried OXide with Etch-Stop process (BOXES). The process uses a silicon-nitride etch-stop layer and a pad layer formed on the substrate before the CVD-oxide is deposited.

Unfortunately, the planarization of shallow trench isolation relies on chemical mechanical polishing (CMP) which has been proven an effective but challenging process. As shown in FIG. 1, on a silicon substrate 1, the challenges associated with CMP for STI include dishing 3 of wide trench, erosion of small nitride, and oxide remaining on large nitride. The dishing degrades the planarity of a layer, and it also impacts the control of implantation. The area denoted by 2 is used for isolated device, silicon nitride may be erode the area, completely. This will damage the Si substrate and devices that are fabricated here. The oxide 4 that remains on the silicon nitride layer makes wet strip of silicon nitride unlikely.

The conventional method to solve above described problems will be described as followed. Turning to FIG. 2, a silicon oxide layer 5 is formed on a substrate 1 for using as a pad layer. The thickness of the silicon oxide layer 5 is about 50–150 angstroms. Then, a silicon-nitride layer 7 is deposited on the pad layer 5 to have a thickness about 500–2000 angstroms.

Still turning to FIG. 2, a photoresist is patterned on the silicon-nitride layer 7 to define nonactive regions. Then, shallow trenches are created by using dry etching. The photoresist is subsequently stripped away while the shallow trenches are formed.

Referring to FIG. 3, a silicon oxide layer 9 is deposited on the silicon-nitride layer 7 and is refilled into the shallow trenches for using as an isolation. Generally speaking, the thickness of the silicon oxide layer 9 is about 5000 to 10000 angstroms. Then, a photoresist 11 is pattern exact over the trenches on the silicon oxide layer 9.

Turning to FIG. 4, a dry etching is used to etch a portion of the silicon oxide layer 9 using the photoresist 11 as an etching mask. Then, the photoresist 11 is removed away. A plurality of protruded portions 9a of the silicon oxide layer 9 are generated after the etching. The protruded portions 9a can eliminate the dishing problem. It is because that the removing rate of the CMP performed over the trench is faster than the neighboring regions. Then, a chemical mechanical polishing (CMP) technology is performed for planarization to the surface of the silicon nitride layer 7.

By using the conventional method can improve the result of the CMP planarization. However, the conventional method needs a photomasking step, an etching process and a step to remove the photomasking. The throughput will decrease by using the conventional method. Therefore, no additional mask method is need for polishing trench oxide.

SUMMARY OF THE INVENTION

A method is disclose to planarize a shallow trench isolation (STI) by using wet selective etchback and chemical mechanical polishing. A thin silicon dioxide layer is formed on the substrate to act as a pad layer. Subsequently, a silicon nitride layer is deposited on the pad layer to serve as a stop layer for subsequent chemical mechanical polishing (CMP). Next, an oxide layer is formed by plasma enhance-TEOS (PE-TEOS) on the silicon nitride layer.

A photoresist is patterned on the PE-TEOS oxide layer to define the isolation region. A shallow trench is subsequently generated by using a dry etching technique. The photoresist is then stripped away. An ozone-TEOS layer is refilled into the trench and formed on the PE-TEOS oxide layer for isolation. The ozone-TEOS oxide is preferably formed by using sub-atmospheric chemical vapor deposition (SACVD). A selective wet etchback is performed to etch the SACVD ozone-TEOS oxide. A residual protrude portion of the ozone-TEOS is remained on the substrate. Subsequently, a chemical mechanical polishing (CMP) technology is used to remove the SACVD ozone-TEOS layer to the surface of the silicon nitride layer for planarization. A thermal annealing is carried out in oxygen ambient for the densification of SACVD ozone-TEOS oxide. A lining oxide is simultaneously formed underlying the ozone-TEOS oxide.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method is disclose to planarize a shallow trench isolation (STI) by using wet selective etchback and chemical mechanical polishing. The present invention not only solves the dishing problem but also uses a maskless method for polishing trench oxide. Further, erosion of small nitride, oxide remaining on large nitride are eliminated by the present invention. As will be seen below, this technique can be used for planarization of a shallow trench isolation.

Figure 1:
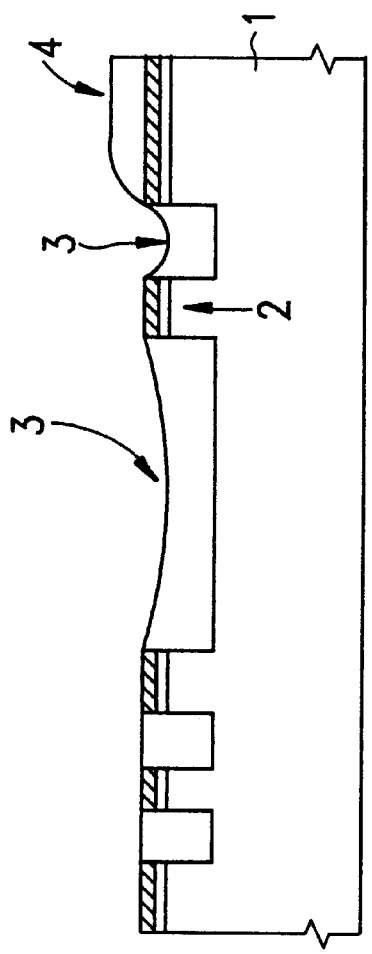
FIG. 1 is a cross section view of a semiconductor wafer illustrating the dishing problem on a substrate in accordance with prior art.
Figure 2:
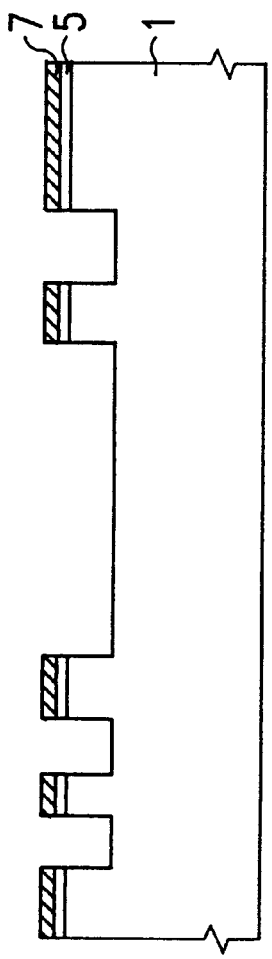
FIG. 2 is a cross section view of a semiconductor wafer illustrating the step of forming shallow trenches in the substrate in accordance with prior art.
Figure 3:
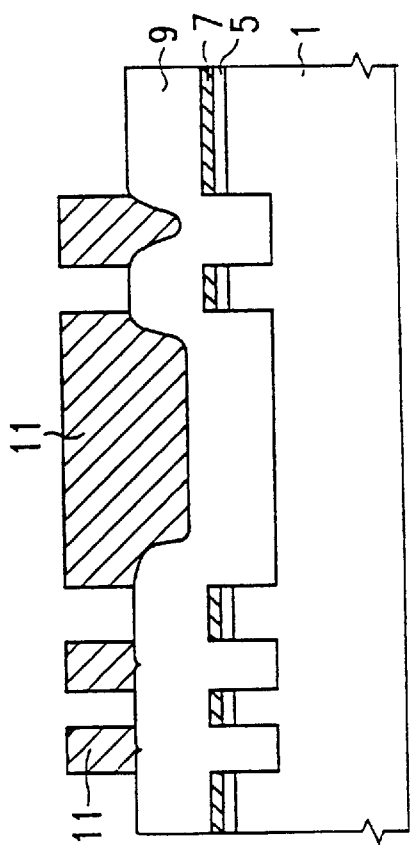
FIG. 3 is a cross section view of a semiconductor wafer illustrating the step of forming a silicon oxide layer in the shallow trenches in accordance with prior art.
Figure 4:
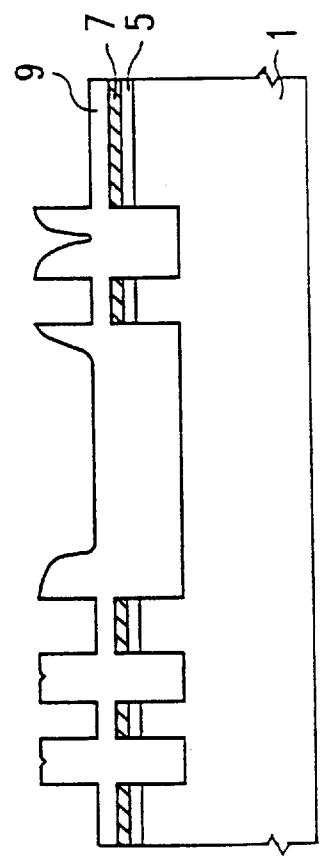
FIG. 4 is a cross section view of a semiconductor wafer illustrating the step of patterning and etching the silicon oxide layer in accordance with prior art.
Figure 5:
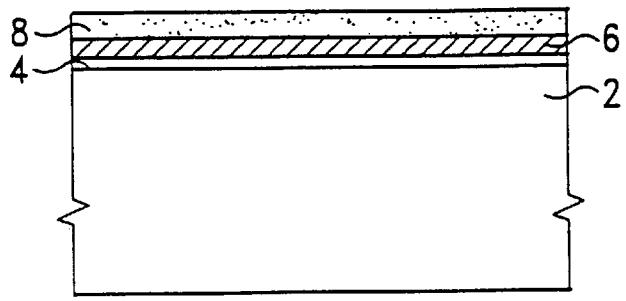
FIG. 5 is a cross section view of a semiconductor wafer illustrating the step of forming a pad oxide, a silicon nitride layer and a PE-TEOS oxide layer on a substrate in accordance with the present invention.

Referring to FIG. 5, in the preferred embodiment a silicon substrate 2 can be p type or n type silicon with <100> crystallographic orientation. A thin silicon dioxide layer 4 is formed on the substrate 2 to act as a pad layer. The silicon dioxide 4 is typically formed by using a thermal oxidation in an oxygen ambient. In one embodiment, the silicon dioxide layer 4 is formed by using an oxygen-steam ambient, at a temperature of about 800–1100° C. Alternatively, the oxide layer 4 may be formed using any suitable oxide chemical compositions and procedures. In this embodiment, the thickness of the silicon dioxide layer is approximately 50–500 angstroms. Subsequently, a silicon nitride layer 6 is deposited on the pad layer 4 to serve as a stop layer for subsequent chemical mechanical polishing (CMP). The silicon nitride layer 6 can be deposited by any suitable process. For example, Low Pressure Chemical Vapor Deposition (LPCVD), Plasma Enhanced Chemical Vapor Deposition (PECVD), High Density Plasma Chemical Vapor Deposition (HDPCVD). The thickness of the silicon nitride layer is about 500 to 2000 angstroms. Further, the temperature to form the silicon nitride layer 6 is at a range of 400–800° C. Preferably, the temperature for the CVD is about 400–500° C., and the temperature is about 500–800° C. for LPCVD. In the preferred embodiment, the reaction gases of the step to form silicon nitride layer 6 are $SiH_4$, $NH_3$, $N_2$, $N_2O$ or $SiH_2Cl_2$, $NH_3$, $N_2$, $N_2O$.

Next, an oxide layer 8 is formed by plasma enhanced-TEOS (PE-TEOS) on the silicon nitride layer 6. The thickness of the PE-TEOS oxide layer 8 is about 500 to 2000 angstroms.

Figure 6:
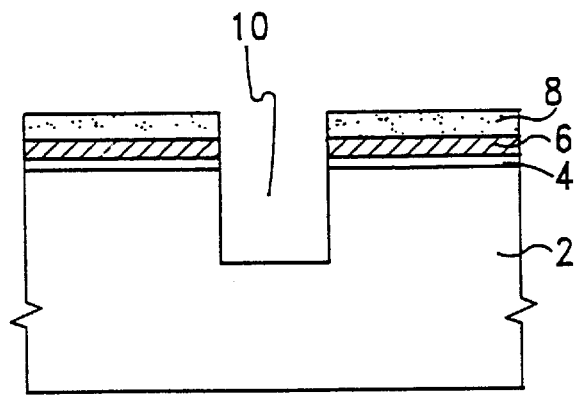
FIG. 6 is a cross section view of a semiconductor wafer illustrating the step of forming a shallow trench in the substrate in accordance with the present invention.

Turning to FIG. 6, a photoresist is patterned on the PE-TEOS oxide layer 8 to define the isolation region. A shallow trench 10 is subsequently generated by using a dry etching technique. The PE-TEOS oxide layer 8, silicon nitride layer 6, the pad layer 4 and the substrate 2 can respectively be etched away by controlling the recipe. Typically, the depth of the shallow trench is about 5000 to 10000 angstroms from the surface of the PE-TEOS oxide layer 8. The photoresist is then stripped away.

Figure 7:
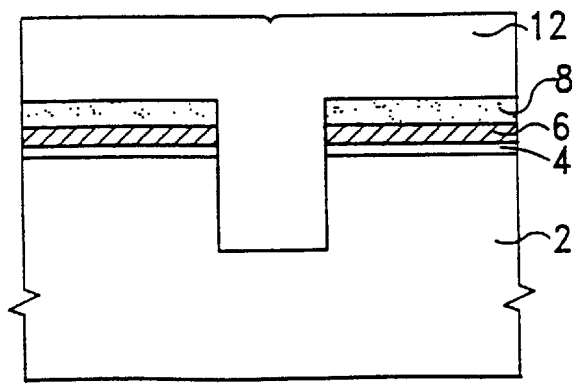
FIG. 7 is a cross section view of a semiconductor wafer illustrating the step of forming a ozone-TEOS in the shallow trench and on the thermal oxide layer in accordance with the present invention.

Turning next to FIG. 7, an ozone-TEOS oxide layer 12 is refilled into the trench 10 and formed on the PE-TEOS oxide layer 8 for isolation. The ozone-TEOS oxide layer 12 indicates that a silicon dioxide is formed by CVD using source gases including TEOS and ozone. The ozone-TEOS is preferably formed by using sub-atmospheric chemical vapor deposition (SACVD). The ozone-TEOS layer is formed at a temperature in the range of about 400 to 480° C. The quality of the SACVD ozone-TEOS oxide 12 that is formed on the silicon is good. Conversely, while the SACVD ozone-TEOS oxide 12 is formed on the PE-TEOS oxide layer 8, the quality of the SACVD ozone-TEOS oxide 12 is poor. The reason of forming the PE-TEOS oxide layer 8 is to make sure the ozone-TEOS layer formed over the trench 10 with better quality than the neighboring ozone-TEOS oxide 12 on the PE-TEOS oxide layer 8. In addition, the wet etching rate of the ozone-TEOS oxide 12 formed on the PE-TEOS oxide layer 8 is about 2000 to 2200 angstroms/minutes, while the one of the ozone-TEOS oxide 12 on the silicon oxide layer 6 is about 300 to 360 angstroms/minutes. The ozone-TEOS oxide 12 formed on the silicon 2 having wet etching rate is about 300 to 320 angstroms/minutes. Thus, the ozone-TEOS oxide 12 formed on the PE-TEOS oxide layer 8 will be removed faster than the one formed on the silicon substrate 2.

Figure 8:
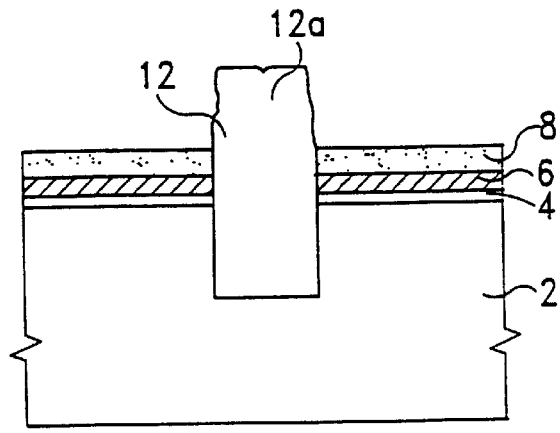
FIG. 8 is a cross section view of a semiconductor wafer illustrating the step of performing selective wet etching to etch the ozone-TEOS in accordance with the present invention.

Referring next to FIG. 8, a selective wet etchback is performed to etch the SACVD ozone-TEOS oxide 12. In the preferred embodiment, the etchant of the etching is diluted HF or BOE (buffer oxide etching). Apparently, the ozone-TEOS oxide 12 on the PE-TEOS 8 is significantly attacked much more than the one on the silicon 2 due to the different etching rate. A residual protrude portion 12a of the ozone-TEOS oxide 12 is remained on the substrate. Thus, although one property of the CMP is that the removing rate over the trench region is faster than its neighboring regions, since the protrude portion 12a is remained over the trench 10. Therefore, there will be no dishing issue. Other conventional problem such as erosion issue will be eliminated by this method. That is to say that the result of CMP will be improved by this method.

Figure 9:
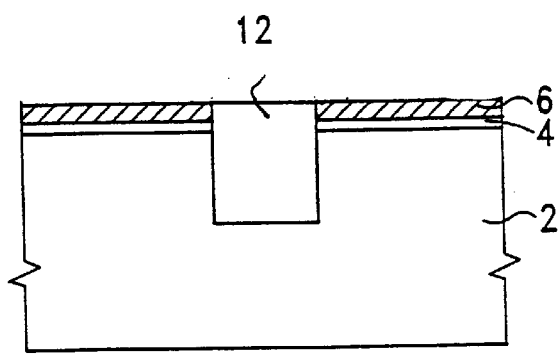
FIG. 9 is a cross section view of a semiconductor wafer illustrating the step of performing a chemical mechanical polishing to the ozone-TEOS layer in accordance with the present invention.

Referring to FIG. 9, subsequently, a chemical mechanical polishing (CMP) technology is used to remove the SACVD ozone-TEOS layer 12 to the surface of the silicon nitride layer 6 for planarization.

Figure 10:
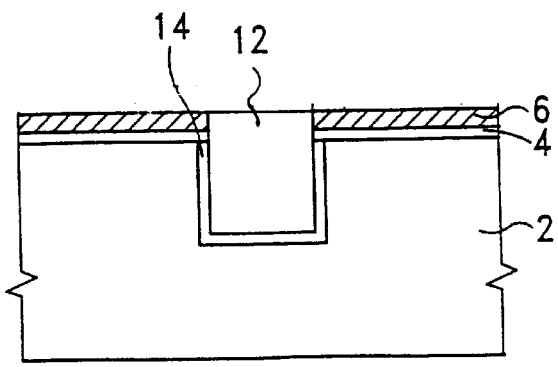
FIG. 10 is a cross section view of a semiconductor wafer illustrating the step of performing a thermal annealing in oxygen ambient for densification of SACVD ozone-TEOS in accordance with the present invention.

Turning next to FIG. 10, a thermal annealing is carried out in oxygen ambient for the densification of SACVD ozone-TEOS oxide. The temperature of the thermal annealing is about 1000 to 1100° C. for about 30 to 120 minutes. The quality of the ozone-TEOS 12 is improved, Further, a lining oxide 14 is simultaneously formed underlying the ozone-TEOS oxide 12. The lining oxide 14 can improve the isolation of the shallow trench isolation. The shrinkage of the method is about 5.53% while the annealing temperature is about 1000° C. and 1100° C., respectively.

The present invention provides a maskless selective wet etching to improve the result of the CMP. Further, the problems that generated by conventional method will be eliminated by the present invention.

As is understood by a person skilled in the art, the foregoing preferred embodiment of the present invention is illustrated of the present invention rather than limiting of the present invention. For example, the present invention uses the ozone-TEOS oxide respectively formed on silicon, PETEOS with different wet etching rate. Then, selective wet etching is used to etch the ozone-TEOS oxide. Thus, any material with different etching rate while formed on different material to improve the result of CMP is covered by the spirit of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a trench isolation on a silicon wafer, said method comprising:

forming a pad layer on said silicon wafer;

forming a silicon nitride layer on said pad layer;

forming a plasma enhanced TEOS (PE-TEOS) oxide layer on said silicon nitride layer;

forming a trench by etching said PE-TEOS oxide layer, said silicon nitride layer, said pad layer and said silicon wafer;

forming an ozone-TEOS oxide layer using source gases comprising TEOS and ozone for isolation on said PE-TEOS oxide layer and filling into said trench, the etching rate of said ozone-TEOS oxide layer on said PE-TEOS oxide layer being faster than the etching rate of said ozone-TEOS layer on said silicon wafer;

differentially etching said ozone-TEOS oxide layer, thereby leaving residual protruded ozone-TEOS oxide layer over said trench; and planarizing said residual protruded ozone-TEOS oxide layer by using chemical mechanical polishing to the surface of said silicon nitride layer.

2. The method of claim 1, further comprises the step of performing a thermal annealing for densification of said ozone-TEOS oxide layer and for forming a lining oxide to improve the isolation of said trench isolation.

3. The method of claim 1, further comprises the following steps of forming said trench:

patterning a photoresist on said PE-TEOS oxide layer to define a trench region; and etching said PE-TEOS oxide layer, said silicon nitride layer, said pad layer and said silicon wafer by using said photoresist as a mask; and removing said photoresist.

4. The method of claim 1, wherein said ozone-TEOS oxide layer is formed by sub-atmospheric CVD.

5. The method of claim 4, wherein said ozone-TEOS oxide layer is formed at a temperature in the range of about 400 to 480° C.

6. The method of claim 1, wherein the thickness of said PE-TEOS oxide layer is about 500 to 2000 angstroms.

7. The method of claim 1, wherein said ozone-TEOS oxide is etched by wet etching, the etchant of said wet etching is selected from the group consisting of HF and BOE (buffer oxide etching).

8. The method of claim 7, wherein the etching rate of said ozone-TEOS on said silicon wafer is about 300 to 320 angstroms/minute.

9. The method of claim 7, wherein the etching rate of said ozone-TEOS on said PE-TEOS oxide layer is about 2000 to 2200 angstroms/minute.

10. The method of claim 7, wherein the etching rate of said ozone-TEOS on said silicon nitride layer is about 300 to 360 angstroms /minute.

11. The method of claim 1, wherein said pad layer is composed of silicon dioxide.

12. The method of claim 11, wherein the thickness of said pad layer is about 50 to 500 angstroms.

13. The method of claim 1, wherein said silicon nitride layer is formed by a method selected from the group consisting of Low Pressure Chemical Vapor Deposition (LPCVD), Plasma Enhanced Chemical Vapor Deposition (PECVD) or High Density Plasma Chemical Vapor Deposition (HDPCVD).

14. The method of claim 13, wherein the reaction gases of forming said silicon nitride layer are $SiH_4$, $NH_3$, $N_2$, $N_2O$.

15. The method of claim 13, wherein the reaction gases of forming said silicon nitride layer are $SiH_2Cl_2$, $NH_3$, $N_2$, $N_2O$.

16. The method of claim 13, wherein the temperature of forming said silicon nitride layer is about 400–800° C.

17. The method of claim 1, wherein the thickness of said silicon nitride layer is about 500 to 2000 angstroms.

18. The method of claim 2, wherein said thermal annealing is carried out in oxygen ambient.

19. The method of claim 18, wherein the temperature of said thermal annealing is about 1000 to 1100° C.

20. The method of claim 18, wherein said thermal annealing is performed about 30 to 120 minutes.

* * * * *